United States Patent
Wang et al.

(10) Patent No.: US 10,324,678 B2
(45) Date of Patent: Jun. 18, 2019

(54) UNFOLDABLE BRACELET DISPLAY DEVICE

(71) Applicant: BOE TECHNOLOGY GROUP CO., LTD., Beijing (CN)

(72) Inventors: Wenbo Wang, Beijing (CN); Jianbang Huang, Beijing (CN); Zhilei Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 175 days.

(21) Appl. No.: 15/520,336

(22) PCT Filed: Sep. 30, 2016

(86) PCT No.: PCT/CN2016/101079
§ 371 (c)(1),
(2) Date: Apr. 19, 2017

(87) PCT Pub. No.: WO2017/121148
PCT Pub. Date: Jul. 20, 2017

(65) Prior Publication Data
US 2018/0110144 A1    Apr. 19, 2018

(30) Foreign Application Priority Data
Jan. 14, 2016    (CN) .......................... 2016 1 0023988

(51) Int. Cl.
*G06F 3/14* (2006.01)
*G06F 3/01* (2006.01)
(Continued)

(52) U.S. Cl.
CPC ............ *G06F 3/1446* (2013.01); *G06F 1/163* (2013.01); *G06F 1/1647* (2013.01);
(Continued)

(58) Field of Classification Search
CPC .......... G06F 1/163; G06F 1/1641; G06F 3/14; G06F 3/1446; H05K 5/0226;
(Continued)

(56) References Cited

U.S. PATENT DOCUMENTS 8,891,035 B2    11/2014  Ooishi
8,899,791 B2    12/2014  Liu
(Continued)

FOREIGN PATENT DOCUMENTS

CN    102141697 A    8/2011
CN    104505003 A    4/2015
(Continued)

OTHER PUBLICATIONS

International Search report forms 210, 237 dated Jan. 5, 2017 in corresponding International Application No. PCT/CN2016/101079 along with an English translation of the International Search Report and an English translation of the Written Opinion of the International Searching Authority.
(Continued)

*Primary Examiner* — Darlene M Ritchie
(74) *Attorney, Agent, or Firm* — Nath, Goldberg & Meyer; Joshua B. Goldberg

(57) ABSTRACT

The present disclosure provides a display device comprising: at least one flexible display panel; and a connective assembly capable of getting the display device into a ring display state where the at least one flexible display panel forms a ring shape, and getting the display device into a flat panel display state where the at least one flexible display panel all has a display surface towards the same direction. The display device can be used as a flat panel display device, e.g., mobile phone, in the flat panel display state, while in the ring display state, the display device can be used as a
(Continued)

bracelet. When used as a bracelet, the display device requires no other assistant devices.

13 Claims, 3 Drawing Sheets

(51) Int. Cl.
G06F 1/16 (2006.01)
G09G 3/20 (2006.01)
H04M 1/02 (2006.01)
H05K 5/00 (2006.01)
H05K 5/02 (2006.01)
G09F 9/302 (2006.01)

(52) U.S. Cl.
CPC ............ *G06F 1/1652* (2013.01); *G06F 3/014* (2013.01); *G09G 3/20* (2013.01); *G09G 3/2092* (2013.01); *H04M 1/0216* (2013.01); *H04M 1/0268* (2013.01); *H05K 5/0017* (2013.01); *H05K 5/0226* (2013.01); *G06F 3/14* (2013.01); *G09F 9/3023* (2013.01); *G09G 2300/026* (2013.01); *G09G 2300/043* (2013.01); *G09G 2300/0408* (2013.01); *G09G 2300/0426* (2013.01); *G09G 2310/027* (2013.01); *G09G 2310/0286* (2013.01); *G09G 2380/02* (2013.01); *H04M 1/021* (2013.01); *H04M 1/0243* (2013.01); *H04M 2250/16* (2013.01)

(58) Field of Classification Search
CPC .............. H05K 5/0017; H04M 1/0216; H04M 1/0268; H04M 1/0243; H04M 1/021; H04M 2250/16; G09G 3/20; G09G 3/2092; G09G 2300/0408; G09G 2300/043; G09G 2300/0426; G09G 2300/026; G09G 2310/027; G09G 2310/0286; G09G 2380/02; E05D 11/0081; E05Y 2900/606
See application file for complete search history.

(56) References Cited

U.S. PATENT DOCUMENTS

| | | | | |
|---|---|---|---|---|
| 9,983,710 B2 * | 5/2018 | Jiang | ............... | G06F 1/1626 |
| 2005/0264471 A1 * | 12/2005 | Yamazaki | ............ | G06F 3/1446 345/1.1 |
| 2007/0247439 A1 * | 10/2007 | Daniel | ................. | G06F 1/1601 345/173 |
| 2014/0049464 A1 * | 2/2014 | Kwak | .................. | G06F 3/0487 345/156 |
| 2014/0192530 A1 * | 7/2014 | Liu | ......................... | H05K 5/02 362/249.02 |
| 2014/0205772 A1 * | 7/2014 | Sitton | ................ | G09F 15/0062 428/12 |
| 2015/0089974 A1 | 4/2015 | Seo et al. | | |
| 2015/0138103 A1 * | 5/2015 | Nishi | .................. | G02F 1/13452 345/173 |
| 2015/0242083 A1 * | 8/2015 | Rainisto | ............... | G06F 3/0485 715/784 |
| 2015/0339967 A1 * | 11/2015 | Shin | ..................... | G06F 3/1446 345/690 |
| 2016/0011709 A1 * | 1/2016 | Nicolas | ................ | G06F 1/3262 345/174 |
| 2016/0188098 A1 * | 6/2016 | Her | ..................... | G06F 3/0416 345/173 |
| 2016/0283086 A1 * | 9/2016 | Inagaki | ................ | G06F 1/1626 |
| 2016/0295709 A1 * | 10/2016 | Ahn | ..................... | H05K 5/0017 |
| 2016/0327987 A1 * | 11/2016 | Huitema | .............. | G06F 1/1652 |
| 2016/0349790 A1 * | 12/2016 | Connor | ................ | G06F 1/1694 |
| 2017/0094817 A1 * | 3/2017 | Kang | ..................... | G09F 9/3023 |
| 2017/0127539 A1 * | 5/2017 | Drabant | .............. | H05K 5/0021 |
| 2017/0262134 A1 * | 9/2017 | Eriksson | ................ | G06F 3/017 |
| 2018/0321892 A1 * | 11/2018 | Kim | ..................... | G06F 1/1601 |

FOREIGN PATENT DOCUMENTS

| | | |
|---|---|---|
| CN | 204632261 U | 9/2015 |
| CN | 105632345 A | 6/2016 |
| JP | 2013-50547 A | 3/2013 |
| JP | 5818583 B2 | 11/2015 |
| KR | 10-2015-0135731 A | 12/2015 |

OTHER PUBLICATIONS

Office Action dated Nov. 23, 2017 issued in corresponding Chinese Application No. 201610023988.2.

* cited by examiner

UNFOLDABLE BRACELET DISPLAY DEVICE

This is a National Phase Application filed under 35 U.S.C. 371 as a national stage of PCT/CN2016/101079, filed Sep. 30, 2016, an application claiming the benefit of Chinese Application No. 201610023988.2, filed Jan. 14, 2016, the content of each of which is hereby incorporated by reference in its entirety.

TECHNICAL FIELD

The present disclosure relates to the field of display devices, and particularly relates to a display device capable of switching between a flat panel display state and a ring display state.

RELATED ART

At present, mobile phone and smart bracelet are two separate kinds of products, and some smart bracelets require assistance from phones to achieve certain functions.

Therefore, it is a technical problem for those skilled in the art to solve to provide an electronic product combining functions both of the mobile phone and the smart bracelet.

SUMMARY

The present disclosure has been accomplished in order to solve the above problem and it is an object thereof to provide a display device capable of switching between a flat panel display state and a ring display state.

According to one aspect of the disclosure, there is provided a display device comprising:

at least one flexible display panel; and a connective assembly capable of getting the display device into a ring display state where the at least one flexible display panel forms a ring shape, and getting the display device into a flat panel display state where the at least one flexible display panel all has a display surface towards the same direction.

The at least one flexible display panel may comprise a first flexible display panel and a second flexible display panel.

The connective assembly may comprise a first connective assembly, a second connective assembly and a hinge assembly via which the first flexible display panel and the second flexible display panel connected to each other, the hinge assembly is located at a side of the display device near an edge when the display device is in the flat panel display state;

the first connective assembly may get the display device into the flat panel display state; and the second connective assembly may get the display device into the ring display state.

The first connective assembly may comprise a first magnetic member and a first attracted member attractable by the first magnetic member, wherein one of the first magnetic member and the first attracted member is disposed at a side of the first flexible display panel adjacent to the second flexible display panel when the display device is in the flat panel display state, and the other of the first magnetic member and the first attracted member is disposed at a side of the second flexible display panel adjacent to the first flexible display panel when the display device is in the flat panel display state.

The first flexible display panel may comprise a first display substrate and a first back panel provided opposite to each other, the one of the first magnetic member and the first attracted member provided on the first flexible display panel is disposed on the first back panel and located between the first display substrate and the first back panel; and the second flexible display panel may comprise a second display substrate and a second back panel provided opposite to each other, the one of the first magnetic member and the first attracted member provided on the second flexible display panel is disposed on the second back panel and located between the second display substrate and the second back panel.

The second connective assembly may comprise a second magnetic member and a second attracted member attractable by the second magnetic member, wherein one of the second magnetic member and the second attracted member is located at a side of the first flexible display panel adjacent to the second flexible display panel and not adjacent to the hinge assembly when the display device is in the ring display state, and the other of the second magnetic member and the second attracted member is located at a side of the second flexible display panel adjacent to the first flexible display panel and not adjacent to the hinge assembly when the display device is in the ring display state.

The first flexible display panel may comprise a first display substrate and a first back panel provided opposite to each other, the one of the second magnetic member and the second attracted member provided on the first flexible display panel is disposed on the first back panel and located between the first display substrate and the first back panel; and the second flexible display panel may comprise a second display substrate and a second back panel provided opposite to each other, the one of the second magnetic member and the second attracted member provided on the second flexible display panel is disposed on the second back panel and located between the second display substrate and the second back panel.

The display device may comprise a first chip provided with a first shifting register providing a scanning signal for the first flexible display panel and a first source driving circuit providing a grayscale signal for the first flexible display panel, a second chip provided with a second shifting register providing a scanning signal for the second flexible display panel and a second source driving circuit providing a grayscale signal for the second flexible display panel, and a flexible signal transmission line having one end attached to the second chip and the other end connected to a signal receiving end of the second flexible display panel, wherein the first and second chips are both provided on the first flexible display panel.

The second chip may have a greater size than the first chip.

The display device may further comprise a signal transmission line protector with a groove receiving therein a side of the display device where the flexible signal transmission line is exposed and a part of the flexible signal transmission line when the display device is in the flat panel display state.

The signal transmission line protector may have one end hinged on the first flexible display panel.

The hinge assembly may comprise a first hinge bar, a second hinge bar, a hinge shaft and a slide bar, wherein the signal receiving end of the second flexible display panel is disposed between the slide bar and a side of the second flexible display panel adjacent to the first flexible display panel when the display device is in the ring display state, one end of the first hinge bar is hinged to the back panel of the first flexible display panel, while the other end of the first hinge bar is hinged to one end of the second hinge bar via the hinge shaft, the other end of the second hinge bar is hinged to a central portion of the slide bar, two ends of the slide bar are slidably disposed at two sides of the back panel of the second flexible display panel respectively, and one end of the flexible signal transmission line bypasses the slide bar and gets through a space between the slide bar and the back panel of the second flexible display panel to be electrically connected to the signal receiving end.

The connective assembly may further comprise a third connective assembly including a third magnetic member and a third attracted member attractable by the third magnetic member, wherein one of the third magnetic member and the third attracted member is disposed at a side of the first flexible display panel adjacent to the hinge assembly when the display device is in the ring display state, and the other of the third magnetic member and the third attracted member is disposed at a side of the second flexible display panel adjacent to the hinge assembly when the display device is in the ring display state.

In the display device, the flexible display panel may be bent to deform and formed into a ring shape. The display device comprises a driving circuit for driving the flexible display panel to realize functions thereof.

The display device can be used as a flat panel display device, e.g., mobile phone, in the flat panel display state, while in the ring display state, the display device can be used a bracelet. When used as a bracelet, the display device requires no other assistant devices.

BRIEF DESCRIPTION OF THE DRAWINGS

Accompanying drawings are provided for further understanding of this disclosure and constitute a part of the specification. Hereinafter, these drawings are intended to explain the disclosure together with the following specific embodiments, but should not be considered as a limitation of the disclosure, in which.

Figure 1:
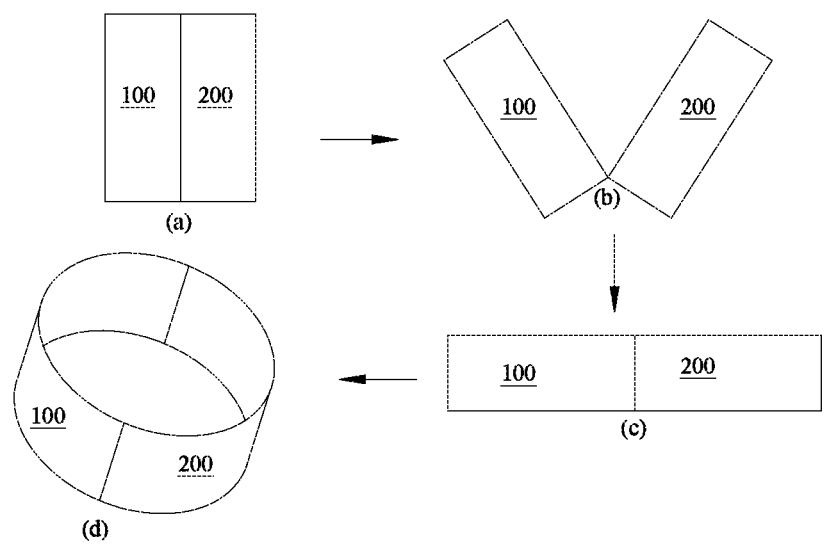
FIG. 1 is a schematic view showing the display device switching between two work modes according to an exemplary embodiment of the present disclosure.

| Reference Signs: | |
|---|---|
| 100: first flexible display panel | 100a: first display substrate |
| 100b: first back panel | 200: second flexible display panel |
| 110: first chip | 120: second chip |
| 130: system board | 140: system board lead circuit |
| 210: signal receiving end | 310: first connective assembly |

| Reference Signs: | |
|---|---|
| 311: first magnetic member | 312: first attracted member |
| 320: second connective assembly | 321: second magnetic member |
| 322: second attracted member | 330: hinge assembly |
| 331: first hinge bar | 332: slide bar |
| 333: hinge shaft | 334: second hinge bar |
| 400: flexible signal transmission line | 500: signal transmission line protector |

DETAILED DESCRIPTION

Hereinafter, specific embodiments of the disclosure will be described in detail in conjunction with the accompanying drawings. It should be understood that the specific embodiments as set forth herein are merely for the purpose of illustration and explanation of the disclosure and should not be constructed as a limitation thereof.

According to one aspect of the disclosure, there is provided a display device comprising: at least one flexible display panel; and a connective assembly capable of getting the display device into a ring display state where the at least one flexible display panel forms a ring shape, and getting the display device into a flat panel display state where the at least one flexible display panel all has a display surface towards the same direction.

In the display device, the flexible display panel may be bent to deform and formed into a ring shape. The display device comprises a driving circuit for driving the flexible display panel to realize functions thereof.

The display device can be used as a flat panel display device, e.g., mobile phone, in the flat panel display state, while in the ring display state, the display device can be used as a bracelet. When used as a bracelet, the display device requires no other assistant devices.

The number of flexible display panels is not particularly defined in the present disclosure. For example, as one embodiment of the present disclosure, the display device may comprise only one flexible display panel. In such case, the display device may be turned into a flat panel display state by spreading out the flexible display panel and into a ring display state by fixedly connecting one end of the flexible display panel to the other end via the connective assembly.

As another embodiment of the present disclosure, the display device may comprise a plurality of flexible display panels. In such embodiment, when the display device is in the flat panel display state, all the flexible display panels have a display surface towards the same direction so as to be stitched together to display. That is, the plurality of flexible display panels are stitched into the display surface of the display device to display one image. When the display device is in the ring display state, the plurality of flexible display panels form a ring shape end to end. It is easy to understand that all the flexible display panels have a display surface towards the outside of the ring formed by the plurality of flexible display panels in the ring display state, so as to facilitate operation and view.

As a preferred embodiment of the present application, the display device comprises two flexible display panels. As shown in FIG. 1, the display device comprises a first flexible display panel 100 and a second flexible display panel 200. As shown in FIG. 1(*a*), the connective assembly may get the display device into a flat panel display state where the first flexible display panel 100 and the second flexible display panel 200 both have a display surface towards the same direction, and as shown in FIG. 1(d), the connective assembly may also get the display device into a ring display state where the first flexible display panel 100 and the second flexible display panel 200 form a ring shape. In the ring display state, the display surfaces of the first flexible display panel 100 and the second flexible display panel 200 are both oriented towards the outside.

If a user wants to realize functions of a mobile phone or a tablet computer with the display device, he/she may use the connective assembly to turn the first flexible display panel 100 and the second flexible display panel 200 into the flat panel display state as shown in FIG. 1(a). If a user wants to realize functions of a bracelet with the display device, he/she may move the first flexible display panel 100 and the second flexible display panel 200 to respectively get through the states shown in FIGS. 1(b) and 1(c), and then connect the non-adjacent ends of the first flexible display panel 100 and the second flexible display panel 200 which have been stitched together as shown in FIG. 1(c) so as to obtain the display device in a ring shape shown in FIG. 1(d), and finally use the connective assembly to turn the first flexible display panel 100 and the second flexible display panel 200 into a ring display state.

Figure 2:
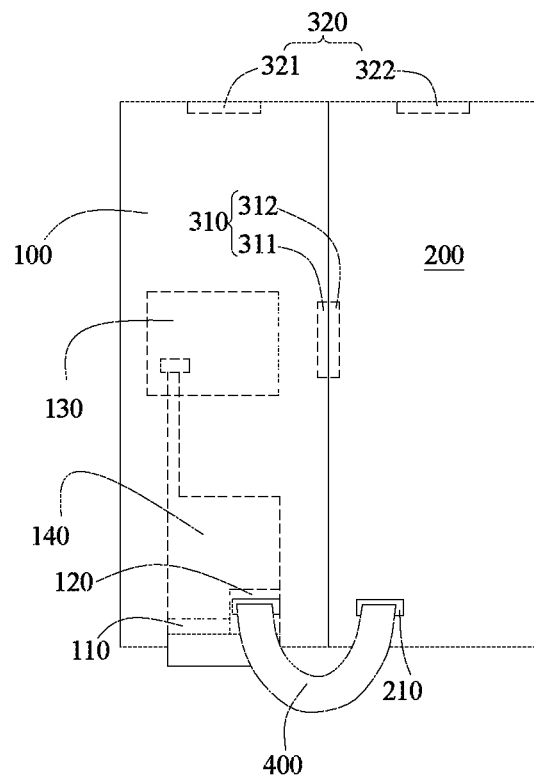
FIG. 2 is a schematic view showing an embodiment of the display device in a flat panel display state according to an exemplary embodiment of the present disclosure.
Figure 3:
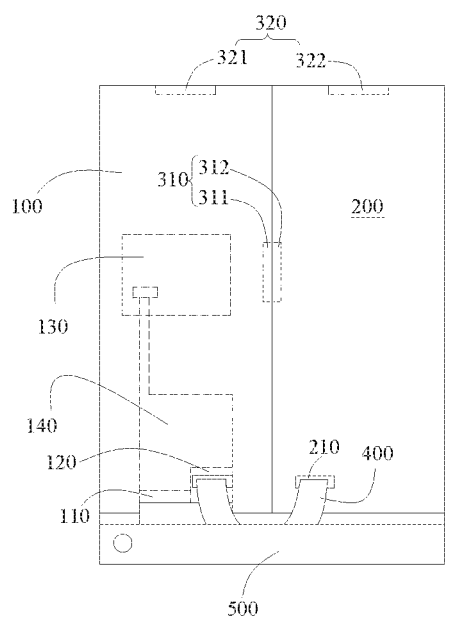
FIG. 3 is a schematic view showing another embodiment of the display device in the flat panel display state according to an exemplary embodiment of the present disclosure.

The specific structure of the connective assembly is not particularly defined in the present disclosure as long as it can turn the first flexible display panel 100 and the second flexible display panel 200 into the above two display states. As a specific embodiment of the disclosure, the connective assembly may comprise a first connective assembly 310 (FIGS. 2-3), a second connective assembly 320 (FIGS. 2-3) and a hinge assembly 330 (FIGS. 5 and 7), and the first flexible display panel 100 and the second flexible display panel 200 are connected to each other via the hinge assembly 330. When the display device is in the flat panel display state, the hinge assembly 330 is located at a side of the display device near an edge, which can improve operability of the hinge assembly 330 compared with the case where the hinge assembly 330 is located in the middle of the display device. The first connective assembly 310 may get the display device into the flat panel display state, and the second connective assembly 320 may get the display device into the ring display state.

The first flexible display panel 100 and the second flexible display panel 200 relatively move with respect to the hinge assembly 330 upon changes in the display state of the display device.

The specific structure of the first connective assembly 310 is not particularly defined in the present disclosure. As a preferred embodiment of the present disclosure, the first connective assembly 310 comprises a first magnetic member 311 and a first attracted member 312 attractable by the first magnetic member 311. One of the first magnetic member 311 and the first attracted member 312 is disposed at a side of the first flexible display panel 100 adjacent to the second flexible display panel 200 when the display device is in the flat panel display state, and the other of the first magnetic member 311 and the first attracted member 312 is disposed at a side of the second flexible display panel 200 adjacent to the first flexible display panel 100 when the display device is in the flat panel display state. When the first flexible display panel 100 and the second flexible display panel 200 are stitched into the flat panel display state, the first magnetic member 311 attracts the first attracted member 312 to form a fixed connection between the first flexible display panel 100 and the second flexible display panel 200 so that the display device is kept in the flat panel display state. In the present disclosure, the first attracted member 312 may be magnetic or not. For example, the first magnetic member 311 may be made of a permanent magnet or an electromagnet, and the first attracted member 312 may also be made of a permanent magnet or an electromagnet, or made of, for example, ferromagnetic materials (e.g., iron, cobalt, nickel and the like).

In each embodiment of the present disclosure, the first magnetic member 311 is disposed on the first flexible display panel 100 while the first attracted member 312 is disposed on the second flexible display panel 200. However, the disclosure is not limited thereto. For example, the first magnetic member 311 may be disposed on the second flexible display panel 200 while the first attracted member 312 is disposed on the first flexible display panel 100.

Figure 4:
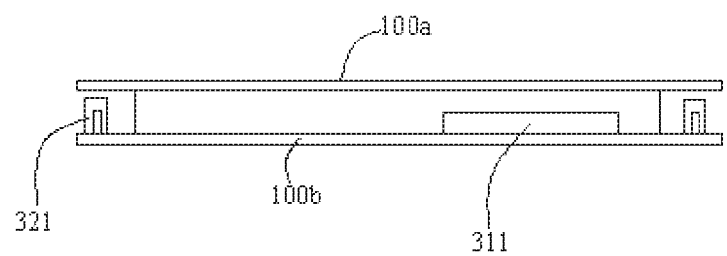
FIG. 4 is a side view of the first flexible display panel showing the specific setting manner of the first connective assembly and the second connective assembly.

As shown in FIG. 4, the first flexible display panel 100 may comprise a first display substrate 100a and a first back panel 100b provided opposite to each other. Similarly, the second flexible display panel 200 may comprise a second display substrate and a second back panel provided opposite to each other.

The specific setting manner of the first magnetic member 311 and the first attracted member 312 is not particularly defined in the present disclosure. When the first flexible display panel 100 and the second flexible display panel 200 have the above structures, the one of the first magnetic member 311 and the first attracted member 312 provided on the first flexible display panel 100 (the first magnetic member 311 in the embodiment shown in FIG. 4) is disposed on the first back panel 100b and located between the first display substrate 100a and the first back panel 100b.

Accordingly, the one of the first magnetic member 311 and the first attracted member 312 provided on the second flexible display panel 200 is disposed on the second back panel and located between the second display substrate and the second back panel.

The specific structure of the second connective assembly 320 is not particularly defined in the present disclosure, either. As a preferred embodiment of the present disclosure, the second connective assembly 320 comprises a second magnetic member 321 and a second attracted member 322 attractable by the second magnetic member 321. One of the second magnetic member 321 and the second attracted member 322 is located at a shorter edge of the first flexible display panel 100 adjacent to the second flexible display panel 200 and not adjacent to the hinge assembly 330 when the display device is in the ring display state, and the other of the second magnetic member 321 and the second attracted member 322 is located at a side of the second flexible display panel 200 adjacent to the first flexible display panel 100 and not adjacent to the hinge assembly 330 when the display device is in the ring display state.

After the first flexible display panel 100 and the second flexible display panel 200 are relatively rotated with respect to the hinge assembly 330 so as to be connected at end faces thereof, the first flexible display panel 100 and the second flexible display panel 200 are bent so that the shorter edge of the first flexible display panel 100 provided with one of the second magnetic member 321 and the second attracted member 322 is connected with the shorter edge of the second flexible display panel 200 provided with the other of the second magnetic member 321 and the second attracted member 322 to form a ring. The second magnetic member 321 attracts the second attracted member 322 to form a fixed connection between the shorter edge of the first flexible display panel 100 and the shorter edge of the second flexible display panel 200 so that the display device remains in the ring display state.

Similar to the first connective assembly 310, the second magnetic member 321 in the second connective assembly 320 may be a permanent magnet or an electromagnet. The second attracted member 322 may be a magnetic permanent magnet or an electromagnet, or made of ferromagnetic materials (e.g., iron, cobalt, nickel and the like).

In the disclosure, the setting manner of the second connective assembly 320 may be similar to that of the first connective assembly 310. That is, the first flexible display panel 100 comprises a first display substrate 100a and a first back panel 100b provided opposite to each other, the one of the second magnetic member 321 and the second attracted member 322 provided on the first flexible display panel 100 is disposed on the first back panel 100b and located between the first display substrate 100a and the first back panel 100b; the second flexible display panel 200 comprises a second display substrate and a second back panel provided opposite to each other, the one of the second magnetic member 321 and the second attracted member 322 provided on the second flexible display panel 200 is disposed on the second back panel and located between the second display substrate and the second back panel.

In order to maintain steady operation of the display device in the ring state, it is preferred that the connective assembly may further comprise a third connective assembly including a third magnetic member and a third attracted member attractable by the third magnetic member, wherein one of the third magnetic member and the third attracted member is disposed at a side of the first flexible display panel 100 adjacent to the hinge assembly 330 when the display device is in the ring display state, and the other of the third magnetic member and the third attracted member is disposed at a side of the second flexible display panel 200 adjacent to the hinge assembly 330 when the display device is in the ring display state. When the display device forms a ring shape, an attraction is generated between the third magnetic member and the third attracted member so that the side of the first flexible display panel 100 adjacent to the hinge assembly 330 is connected to the side of the second flexible display panel 200 adjacent to the hinge assembly 330 to keep the display device in the ring shape.

In the present disclosure, the first flexible display panel 100 and the second flexible display panel 200 may be separate devices and respectively driven by different driving circuits.

In order to improve integrated degree of the display device and facilitate assembly thereof, it is preferred that the display device comprises a first chip 110, a second chip 120 and a flexible signal transmission line 400. The first chip 110 and the second chip 120 are both disposed on the first flexible display panel 100. The first chip 110 is provided with a first shifting register providing a scanning signal for the first flexible display panel 100 and a first source driving circuit providing a grayscale signal for the first flexible display panel 100, while the second chip 120 is provided with a second shifting register providing a scanning signal for the second flexible display panel 200 and a second source driving circuit providing a grayscale signal for the second flexible display panel 200. One end of the flexible signal transmission line 400 is attached to the second chip 120 while the other end of the flexible signal transmission line 400 is connected to a signal receiving end 210 of the second flexible display panel 200 so that the scanning signal for driving the second flexible display panel 200 is transmitted to the signal receiving end 210 of the second flexible display panel 200.

Preferably, the first chip 110 and the second chip 120 may both be Chip On Flex (COF). In addition, the first chip 110 and the second chip 120 may be integrated to improve the integrated degree of the display device.

Since the flexible signal transmission line 400 is attached to the second chip 120, the second chip 120 preferably has a greater size than the first chip 110 so as to facilitate attachment of the flexible signal transmission line 400.

It is easy to understand that in order to guarantee normal display of the display device, the display device may further comprise, on the first flexible display panel 100, a system board 130 for analyzing an input signal and generating a control signal and a system board lead circuit 140 for transmitting the control signal to the first chip 110 and the second chip 120. The first chip 110 and the second chip 120 generate corresponding scanning signals and grayscale signals according to the received control signal.

Since the flexible signal transmission line 400 is located outside of the display panel, in order to prevent it from being destroyed by external forces, it is preferred that the display device further comprises a signal transmission line protector 500 with a groove. When the display device is in the flat panel display state, a side of the display device where the flexible signal transmission line 400 is exposed and a part of the flexible signal transmission line 400 are located in the groove.

In order to prevent the protector 500 from being lost and facilitate switching of the display device between the two display states, it is preferred that the protector 500 has one end hinged on the first flexible display panel 100. When the display device needs to be switched into the flat panel display state, the protector 500 may be rotated to a state capable of accommodating the flexible signal transmission line 400. When the display device needs to be switched into the ring display state from the flat panel display state, the protector 500 may be rotated to release the flexible signal transmission line 400.

Figure 5:
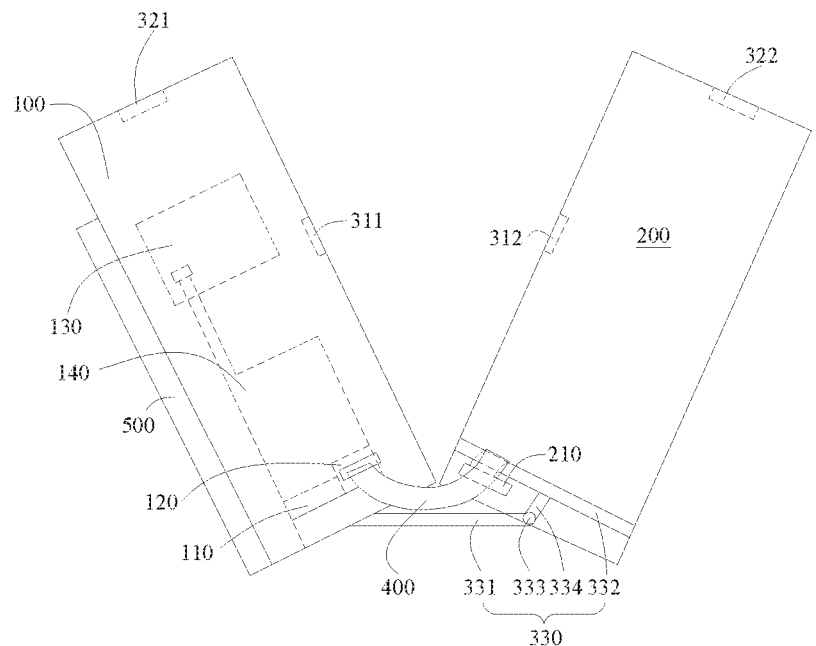
FIG. 5 is a schematic view showing a first intermediate process where the display device shown in FIG. 3 switches from the flat panel display state to a ring display state.
Figure 6:
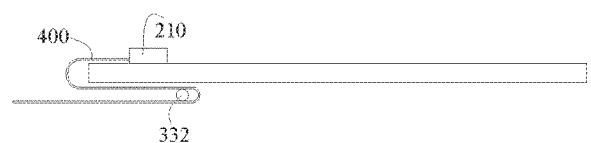
FIG. 6 is a partial schematic view of the second flexible display panel.
Figure 7:
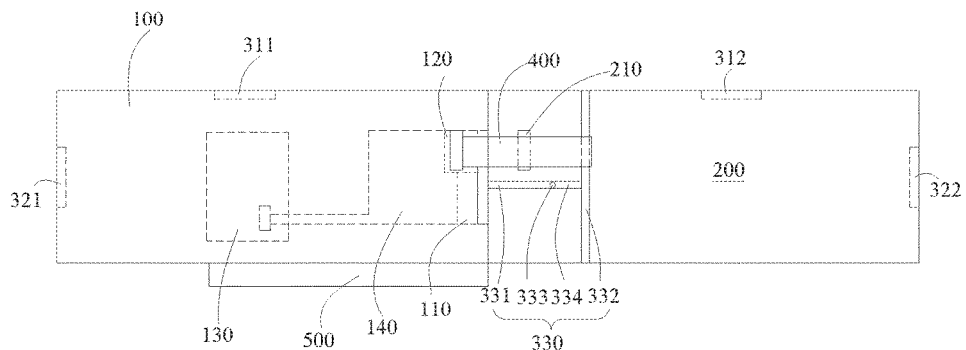
FIG. 7 is a schematic view showing a second intermediate process where the display device shown in FIG. 3 switches from the flat panel display state to the ring display state.

The specific structure of the hinge assembly 330 is not particularly defined in the present disclosure. In one preferred embodiment of the disclosure, as shown in FIGS. 5 and 7, the hinge assembly 330 comprises a first hinge bar 331, a second hinge bar 334, a hinge shaft 333 and a slide bar 332. One end of the first hinge bar 331 is hinged to the back panel 100b of the first flexible display panel 100, and the other end of the first hinge bar 331 is hinged to one end of the second hinge bar 334 via the hinge shaft 333. The other end of the second hinge bar 334 is hinged to a central portion of the slide bar 332. Two ends of the slide bar 332 are slidably disposed at two sides of the back panel of the second flexible display panel 200 respectively. As shown in FIG. 6, the signal receiving end 210 of the second flexible display panel 200 is disposed between the slide bar 332 and a side of the second flexible display panel 200 adjacent to the first flexible display panel 100 when the display device is in the ring display state, and one end of the flexible signal transmission line 400 bypasses the slide bar 332 and gets through a space between the slide bar 332 and the back panel of the second flexible display panel 200 to be electrically connected to the signal receiving end 210.

It shall note that the first hinge bar 331 and the second hinge bar 334 are both made of materials with both elasticity and rigidity. That is, the first hinge bar 331 and the second hinge bar 334 will not be bent to deform in normal conditions. However, when the display device is in the ring display state, the first hinge bar 331 and the second hinge bar 334 may deform as the first flexible display panel 100 and the second flexible display panel 200 deform.

By providing the hinge assembly 330 with a first hinge bar 331, a second hinge bar 334, a hinge shaft 333 and a slide bar 332, it may not only connect the first flexible display panel 100 and the second flexible display panel 200 together without interfering their relative movements, but also guide and fix the flexible signal transmission line 400.

It should be understood that the above embodiments are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. A display device comprising:
   at least one flexible display panel; and
   a connective assembly capable of getting the display device into a ring display state where the at least one flexible display panel forms a ring shape, and getting the display device into a flat panel display state where the at least one flexible display panel all has a display surface towards the same direction,
   wherein the at least one flexible display panel comprises a first flexible display panel and a second flexible display panel,
   wherein the connective assembly comprises a first connective assembly, a second connective assembly and a hinge assembly via which the first flexible display panel and the second flexible display panel are connected to each other,
   wherein the hinge assembly is located at a side of the display device near an edge when the display device is in the flat panel display state,
   wherein the first connective assembly is able to get the display device into the flat panel display state,
   wherein the second connective assembly is able to get the display device into the ring display state, and
   wherein the first connective assembly comprises a first magnetic member and a first attracted member attractable by the first magnetic member, and wherein one of the first magnetic member and the first attracted member is disposed at a side of the first flexible display panel adjacent to the second flexible display panel when the display device is in the flat panel display state, and the other of the first magnetic member and the first attracted member is disposed at a side of the second flexible display panel adjacent to the first flexible display panel when the display device is in the flat panel display state.

2. The display device according to claim 1,
   wherein the connective assembly further comprises a third connective assembly including a third magnetic member and a third attracted member attractable by the third magnetic member, wherein one of the third magnetic member and the third attracted member is disposed at a side of the first flexible display panel adjacent to the hinge assembly when the display device is in the ring display state, and the other of the third magnetic member and the third attracted member is disposed at a side of the second flexible display panel adjacent to the hinge assembly when the display device is in the ring display state.

3. The display device according to claim 1,
   wherein the first flexible display panel comprises a first display substrate and a first back panel provided opposite to each other, the one of the first magnetic member and the first attracted member provided on the first flexible display panel is disposed on the first back panel and located between the first display substrate and the first back panel; and
   wherein the second flexible display panel comprises a second display substrate and a second back panel provided opposite to each other, the one of the first magnetic member and the first attracted member provided on the second flexible display panel is disposed on the second back panel and located between the second display substrate and the second back panel.

4. The display device according to claim 3,
   wherein the display device comprises a first chip provided with a first shifting register providing a scanning signal for the first flexible display panel and a first source driving circuit providing a grayscale signal for the first flexible display panel, a second chip provided with a second shifting register providing a scanning signal for the second flexible display panel and a second source driving circuit providing a grayscale signal for the second flexible display panel, and a flexible signal transmission line having one end attached to the second chip and the other end connected to a signal receiving end of the second flexible display panel, and wherein the first and second chips are both provided on the first flexible display panel.

5. The display device according to claim 1,
   wherein the second connective assembly comprises a second magnetic member and a second attracted member attractable by the second magnetic member, wherein one of the second magnetic member and the second attracted member is disposed at a side of the first flexible display panel adjacent to the second flexible display panel and not adjacent to the hinge assembly when the display device is in the ring display state, and the other of the second magnetic member and the second attracted member is disposed at a side of the second flexible display panel adjacent to the first flexible display panel and not adjacent to the hinge assembly when the display device is in the ring display state.

6. The display device according to claim 5,
   wherein the display device comprises a first chip provided with a first shifting register providing a scanning signal for the first flexible display panel and a first source driving circuit providing a grayscale signal for the first flexible display panel, a second chip provided with a second shifting register providing a scanning signal for the second flexible display panel and a second source driving circuit providing a grayscale signal for the second flexible display panel, and a flexible signal transmission line having one end attached to the second chip and the other end connected to a signal receiving end of the second flexible display panel, and wherein the first and second chips are both provided on the first flexible display panel.

7. The display device according to claim 5,
   wherein the first flexible display panel comprises a first display substrate and a first back panel provided opposite to each other, the one of the second magnetic member and the second attracted member provided on the first flexible display panel is disposed on the first back panel and located between the first display substrate and the first back panel; and wherein the second flexible display panel comprises a second display substrate and a second back panel provided opposite to each other, the one of the second magnetic member and the second attracted member provided on the second flexible display panel is disposed on the second back panel and located between the second display substrate and the second back panel.

8. The display device according to claim 7,
wherein the display device comprises a first chip provided with a first shifting register providing a scanning signal for the first flexible display panel and a first source driving circuit providing a grayscale signal for the first flexible display panel, a second chip provided with a second shifting register providing a scanning signal for the second flexible display panel and a second source driving circuit providing a grayscale signal for the second flexible display panel, and a flexible signal transmission line having one end attached to the second chip and the other end connected to a signal receiving end of the second flexible display panel, and wherein the first and second chips are both provided on the first flexible display panel.

9. The display device according to claim 1,
wherein the display device comprises a first chip provided with a first shifting register providing a scanning signal for the first flexible display panel and a first source driving circuit providing a grayscale signal for the first flexible display panel, a second chip provided with a second shifting register providing a scanning signal for the second flexible display panel and a second source driving circuit providing a grayscale signal for the second flexible display panel, and a flexible signal transmission line having one end attached to the second chip and the other end connected to a signal receiving end of the second flexible display panel, and wherein the first and second chips are both provided on the first flexible display panel.

10. The display device according to claim 9,
wherein the second chip has a greater size than the first chip.

11. The display device according to claim 9, further comprising:
a signal transmission line protector with a groove receiving therein a side of the display device where the flexible signal transmission line is exposed and a part of the flexible signal transmission line when the display device is in the flat panel display state.

12. The display device according to claim 11,
wherein the signal transmission line protector has one end hinged on the first flexible display panel.

13. The display device according to claim 9,
wherein the hinge assembly comprises a first hinge bar, a second hinge bar, a hinge shaft and a slide bar, wherein the signal receiving end of the second flexible display panel is disposed between the slide bar and a side of the second flexible display panel adjacent to the first flexible display panel when the display device is in the ring display state, one end of the first hinge bar is hinged to the back panel of the first flexible display panel, while the other end of the first hinge bar is hinged to one end of the second hinge bar via the hinge shaft, the other end of the second hinge bar is hinged to a central portion of the slide bar, two ends of the slide bar are slidably disposed at two sides of the back panel of the second flexible display panel respectively, and one end of the flexible signal transmission line bypasses the slide bar and gets through a space between the slide bar and the back panel of the second flexible display panel to be electrically connected to the signal receiving end.

* * * * *